(12) United States Patent
Jang et al.

(10) Patent No.: US 8,773,180 B2
(45) Date of Patent: Jul. 8, 2014

(54) DEVICE FOR GENERATING RESET SIGNAL HAVING SUFFICIENT PULSE WIDTH

(71) Applicant: SK hynix Inc., Icheon-si (KR)

(72) Inventors: Jae Min Jang, Icheon-si (KR); Yong Ju Kim, Icheon-si (KR); Dan Han Kwon, Icheon-si (KR); Hae Rang Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/720,943

(22) Filed: Dec. 19, 2012

(65) Prior Publication Data

US 2013/0342245 A1 Dec. 26, 2013

(30) Foreign Application Priority Data

Jun. 20, 2012 (KR) .................. 10-2012-0066239

(51) Int. Cl.
    *H03L 7/00* (2006.01)
(52) U.S. Cl.
    USPC .................. 327/143; 327/142; 327/198

(58) Field of Classification Search
    USPC .......................... 327/142, 143, 198
    See application file for complete search history.

(56) References Cited

U.S. PATENT DOCUMENTS

| 6,188,256 | B1 * | 2/2001 | Birns et al. .................. 327/142 |
| 6,608,508 | B1 * | 8/2003 | Iwaguro et al. .............. 327/142 |
| 7,015,732 | B1 * | 3/2006 | Holloway et al. ............ 327/143 |
| 7,825,705 | B2 * | 11/2010 | Kawakita .................... 327/143 |

FOREIGN PATENT DOCUMENTS

| KR | 100921828 B1 | 10/2009 |
| KR | 1020100022125 A | 2/2010 |

* cited by examiner

*Primary Examiner* — Kenneth B. Wells
(74) *Attorney, Agent, or Firm* — William Park & Associates Patent Ltd.

(57) ABSTRACT

A reset signal generation apparatus includes a reset signal generation unit and a reset signal expansion unit. The reset signal generation unit enables a reset signal and an enable signal in response to a reset input signal, and disables the reset signal in response to a pulse width extension signal. The reset signal expansion unit generates the pulse width extension signal that is enabled for a predetermined time, in response to the enable signal.

12 Claims, 4 Drawing Sheets

US 8,773,180 B2

DEVICE FOR GENERATING RESET SIGNAL HAVING SUFFICIENT PULSE WIDTH

CROSS-REFERENCES TO RELATED APPLICATION

The present application claims priority under 35 U.S.C. §119(a) to Korean application number 10-2012-0066239, filed on Jun. 20, 2012, in the Korean Intellectual Property Office, which is incorporated herein by reference in its entirety as set forth in full.

BACKGROUND

1. Technical Field

The present invention relates generally to a semiconductor apparatus, and more particularly, to a reset signal generation apparatus.

2. Related Art

A semiconductor apparatus performs an initialization operation before a normal operation, and prepares for the normal operation. In order to perform the initialization operation, the semiconductor apparatus receives a command signal from an external source for instructing the initialization operation, or generates a reset signal according to a signal generated therein. In order to stably perform the initialization operation, the reset signal may be normally generated.

FIG. 1 is a diagram schematically illustrating the configuration of a reset signal generation circuit 10 in a conventional art. The conventional reset signal generation circuit 10 receives a reset command signal RSTC for instructing an initialization operation, and sequentially delays the reset command signal RSTC through an inverter chain 11. Then, the reset signal generation circuit 10 logically combines the delayed reset command signals through a NAND gate 12, and generates a low pulse type signal. Furthermore, the reset signal generation circuit 10 increases a pulse width of the low pulse type signal through strength adjustments by a driver 13, a capacitor 14, and the like, thereby finally generating a reset signal RSTB.

As described above, the conventional reset signal RSTB is generated through a plurality of delay elements. However, since the plurality of delay elements is affected by PVT variation, a pulse width of the reset signal may not be sufficiently ensured due to an external voltage level and skew. When the pulse width of the reset signal is not sufficient, internal circuits for performing a normal operation are not normally initialized, resulting in an erroneous operation and a defected semiconductor apparatus.

SUMMARY

A reset signal generation apparatus capable of generating a reset signal having a sufficient pulse width is described herein.

In an embodiment of the present invention, a reset signal generation apparatus includes: a reset signal generation unit configured to enable a reset signal and an enable signal in response to a reset input signal, and to disable the reset signal in response to a pulse width extension signal, and a reset signal expansion unit configured to generate the pulse width extension signal that is enabled for a predetermined time, in response to the enable signal.

In another embodiment of the present invention, a reset signal generation apparatus includes: a test reset pulse generation unit configured to generate a test reset pulse in response to a test signal and a reset signal, a reset signal generation unit configured to enable the reset signal and an enable signal in response to a reset input signal generated from the test reset pulse, and to disable the reset signal in response to a pulse width extension signal, and a reset signal expansion unit configured to generate the pulse width extension signal that is enabled for a predetermined time, in response to the enable signal.

In another embodiment of the present invention, a reset signal generation apparatus includes: a reset command combination unit configured to generate a reset pulse in response to a reset command signal, a test reset pulse generation unit configured to generate a test reset pulse in response to a test signal and a reset signal, a reset signal generation unit configured to enable the reset signal and an enable signal in response to a reset input signal generated from one or more of the reset pulse and the test reset pulse, and to disable the reset signal in response to a pulse width extension signal, and a reset signal expansion unit configured to generate the pulse width extension signal that is enabled for a predetermined time, in response to the enable signal.

BRIEF DESCRIPTION OF THE DRAWINGS

Features, aspects, and embodiments are described in conjunction with the attached drawings, in which.

DETAILED DESCRIPTION

Hereinafter, a reset signal generation apparatus according to the present invention will be described in detail with reference to the accompanying drawings through various embodiments.

Figure 2:
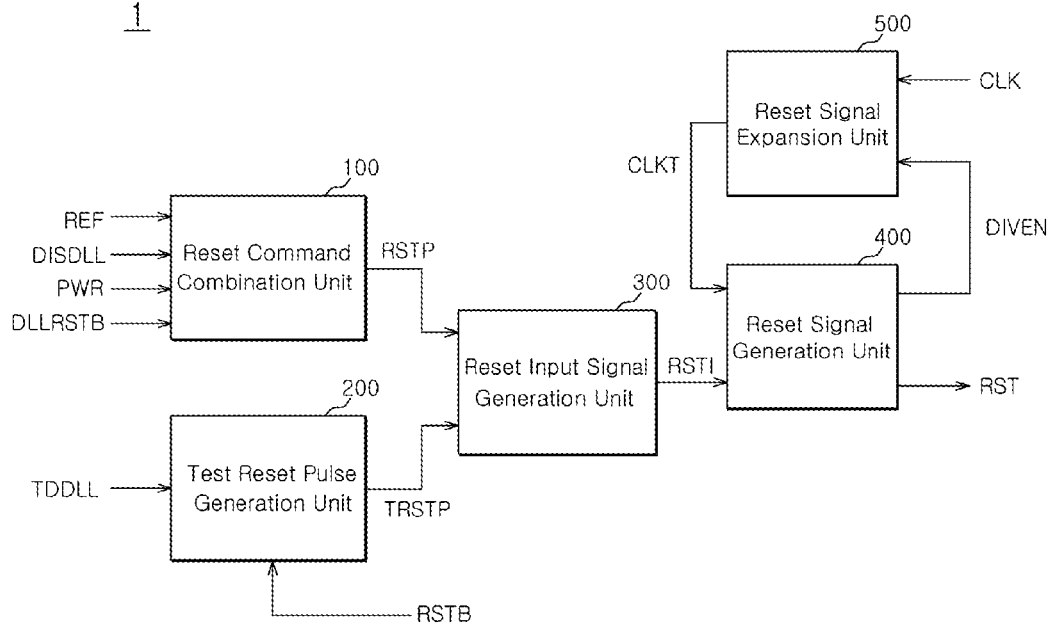
FIG. 2 is a diagram schematically illustrating the configuration of a reset signal generation apparatus according to an embodiment of the present invention.

FIG. 2 is a diagram schematically illustrating the configuration of a reset signal generation apparatus 1 according to an embodiment of the present invention. In FIG. 2, the reset signal generation apparatus 1 includes a reset command combination unit 100, a test reset pulse generation unit 200, a reset input signal generation unit 300, a reset signal generation unit 400, and a reset signal expansion unit 500.

The reset command combination unit 100 is configured to receive a reset command signal and generate a reset pulse RSTP. The reset command signal may include one or more of a refresh signal REF, a DLL initialization signal DISDLL, a power-up signal PWR, and a signal DLLRSTB, hereinafter, referred to as an MRS signal, generated in a mode register set (MRS). However, the invention is not limited thereto. For example, the reset command signal may include all types of reset command signals for instructing an initialization operation. When one or more of the refresh signal REF, the DLL initialization signal DISDLL, the power-up signal PWR, and the MRS signal DLLRSTB are enabled, the reset command combination unit 100 enables the reset pulse RSTP.

The test reset pulse generation unit 200 is configured to receive a test signal TDDLL and generate a test reset pulse TRSTP. When the test signal TDDLL is enabled, the test reset pulse generation unit 200 enables the test reset pulse TRSTP. The test reset pulse generation unit 200 is configured to disable the test reset pulse TRSTP in response to a reset signal RST (not shown). When the reset signal RST is enabled, the test reset pulse generation unit 200 disables the test reset pulse TRSTP. It is possible for the test reset pulse generation unit 200 to receive an inverted signal RSTB of the reset signal and disable the test reset pulse TRSTP.

Figure 1:
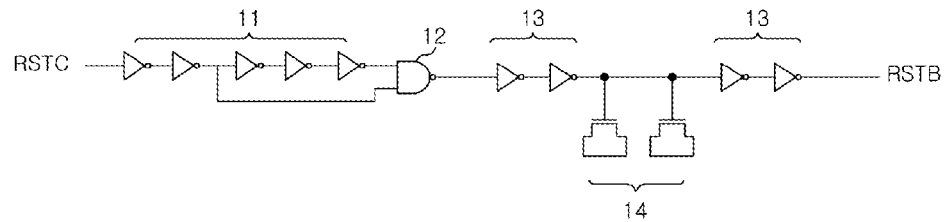
FIG. 1 is a diagram illustrating the configuration of a reset signal generation circuit in the conventional art.

Since the test reset pulse generation unit 200 generates the test reset pulse TRSTP in response to the test signal TDDLL and the inverted signal RSTB of the reset signal, it is possible to generate the reset signal RST using a simple circuit configuration during a test operation. In the conventional art, the test reset pulse is generated from a test signal through the configuration of the reset signal generation circuit 10 illustrated in FIG. 1. However, the test reset pulse generation unit 200 according to an embodiment of the present invention is configured to enable the test reset pulse TRSTP in response to the test signal TDDLL and disable the test reset pulse TRSTP through a feedback of the reset signal RST, so that it is possible to not incorporate a more complex and inefficient circuit such as the circuit configuration of FIG. 1.

The reset input signal generation unit 300 is configured to receive the reset pulse RSTP and the test reset pulse TRSTP, and generates a reset input signal RSTI. When one or more of the reset pulse RSTP and the test reset pulse TRSTP are enabled, the reset input signal generation unit 300 enables the reset input signal RSTI. Consequently, it is possible for the reset input signal generation unit 300 to generate the reset input signal RSTI from the reset pulse RSTP or the test reset pulse TRSTP. In an embodiment, the reset input signal generation unit 300 may be included in the configuration of the reset signal generation unit 400 which will be described below.

The reset signal generation unit 400 is configured to receive the reset input signal RSTI and a pulse width extension signal CLKT, and generate the reset signal RST. The reset signal generation unit 400 is configured to enable the reset signal RST and an enable signal DIVEN in response to the reset input signal RSTI. The reset signal generation unit 400 is configured to disable the reset signal RST in is response to the pulse width extension signal CLKT. When the reset input signal RSTI is enabled, the reset signal generation unit 400 enables the reset signal RST. When the pulse width extension signal CLKT is disabled, the reset signal generation unit 400 disables the reset signal RST.

The reset signal expansion unit 500 is configured to receive the enable signal DIVEN and generate the pulse width extension signal CLKT. When the enable signal DIVEN is enabled, the reset signal expansion unit 500 generates the pulse width extension signal CLKT which is enabled for a predetermined time. When the enable signal DIVEN is enabled, it is also possible for the reset signal expansion unit 500 to divide and delay a clock signal CLK, and generate the pulse width extension signal CLKT.

It is possible for the reset signal generation apparatus 1 to generate a reset signal RST having a sufficient pulse width through the reset signal generation unit 400 and the reset signal expansion unit 500. In an embodiment of the present invention, the reset signal RST may be enabled for a time during which the pulse width extension signal CLKT is disabled, starting from when the reset input signal RSTI was enabled. A pulse width of the reset signal RST may be substantially equal to or wider than the sum of a pulse width of the reset input signal RSTI, a delay time of the clock signal CLK, and a pulse width of the pulse width extension signal CLKT.

Figure 3:
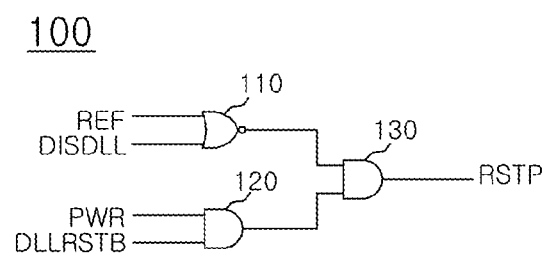
FIG. 3 is a diagram illustrating the configuration of a reset command combination unit of FIG. 2 according to an embodiment of the present invention.

FIG. 3 is a diagram illustrating the configuration of the reset command combination unit 100 of FIG. 2 according to an embodiment of the present invention. In FIG. 3, the reset command combination unit 100 includes a first NOR gate 110, a first AND gate 120, and a second AND gate 130. The first NOR gate 110 is configured to receive the refresh signal REF and the DLL initialization signal DISDLL. The first AND gate 120 is configured to receive the power-up signal PWR and the MRS signal DLLRSTB. The second AND gate 130 is configured to receive the output of the first NOR gate 110 and the output of the first AND gate 120, and to generate the reset pulse RSTP. The refresh signal REF and the DLL initialization signal DISDLL may be level signals, and may be applied at a high level in order to instruct the initialization operation. The power-up signal PWR and the MRS signal DLLRSTB may be signals having a low level pulse. Consequently, in an embodiment of the present invention, the reset command combination unit 100 may be modified according to different application types and levels of the reset command signals. When one or more of the refresh signal REF, the DLL initialization signal DISDLL, the power-up signal PWR, and the MRS signal DLLRSTB are enabled, the reset command combination unit 100 may generate the reset pulse RSTP enabled to a low level.

Figure 4:
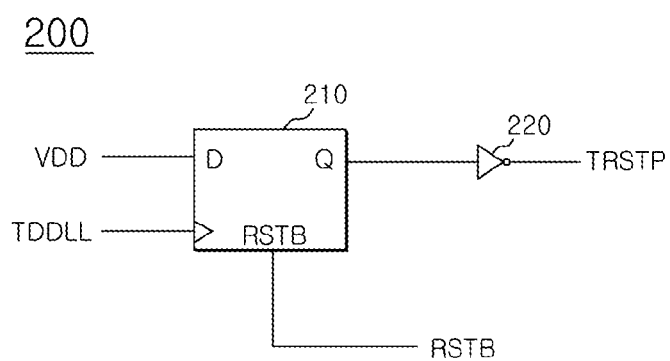
FIG. 4 is a diagram illustrating the configuration of a test reset pulse generation unit of FIG. 2 according to an embodiment of the present invention.

FIG. 4 is a diagram illustrating the configuration of the test reset pulse generation unit 200 of FIG. 2 according to an embodiment of the present invention. In FIG. 4, the test reset pulse generation unit 200 includes a first flip-flop 210 and a first inverter 220. The first flip-flop 210 is configured to receive the test signal TDDLL through a clock terminal thereof, and receive a high level voltage through an input terminal thereof. The high level voltage may include an external voltage VDD. The first flip-flop 210 is reset in response to the reset signal RST (not shown). The first flip-flop 210 may be reset by receiving the inverted signal RSTB of the reset signal. The first inverter 220 is configured to invert the output of the first flip-flop 210 and generate the test reset pulse TRSTP.

Figure 5:
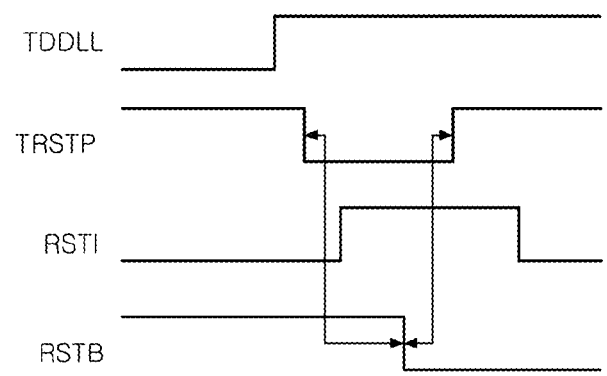
FIG. 5 is a timing diagram illustrating the operation of the test reset pulse generation unit of FIG. 4.

FIG. 5 is a timing diagram illustrating operation of the test reset pulse generation unit 200. With reference to FIG. 2 and FIG. 5, the operation of the test reset pulse generation unit 200 will be described as follows. When the test signal TDDLL at a high level is applied for the test operation, the first flip-flop 210 outputs a high level voltage, and the first inverter 220 inverts the high level voltage and allows the test reset pulse TRSTP to be enabled to a low level. Then, the reset input signal RSTI generated from the test reset pulse TRSTP is enabled, and the reset signal RST is enabled in response to the reset input signal RSTI. When the reset signal RST is enabled to a high level, since the inverted signal RSTB of the reset signal is at a low level, the first flip-flop 210 is reset. Thus, the first flip-flop 210 outputs a low level output signal, and the first inverter 220 inverts the low level output signal and allows the test reset pulse TRSTP to be disabled to a high level. As described above, the reset signal generation apparatus 1 according to an embodiment of the present invention does not require the configuration of the reset signal generation circuit 10 of FIG. 1 in order to generate the test reset pulse TRSTP.

Since the test reset pulse generation unit 200 operates in connection with the reset signal generation unit 400, the test reset pulse generation unit 200 may be realized by a simpler configuration comprising a flip-flop in order to generate the test reset pulse TRSTP.

Figure 6:
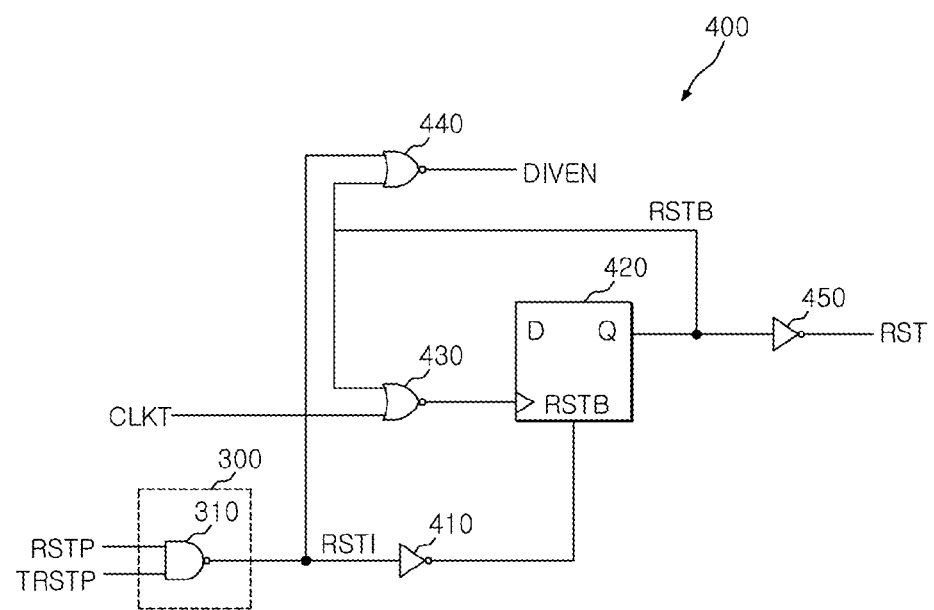
FIG. 6 is a diagram illustrating the configuration of a reset signal generation unit of FIG. 2 according to an embodiment of the present invention.

FIG. 6 is a diagram illustrating the configuration of the reset input signal generation unit 300 and the reset signal generation unit 400 of FIG. 2 according to an embodiment of the present invention. The reset input signal generation unit 300 includes a first NAND gate 310. The first NAND gate 310 is configured to receive the reset pulse RSTP and the test reset pulse TRSTP, and generates the reset input signal RSTI. Since the reset pulse RSTP and the test reset pulse TRSTP are enabled to a low level, when one or more of the reset pulse RSTP and the test reset pulse TRSTP are enabled, it is possible for the reset input signal generation unit 300 to generate the reset input signal RSTI which is enabled to a high level. Furthermore, when the reset pulse RSTP and the test reset pulse TRSTP are disabled to a high level, it is possible for the reset input signal generation unit 300 to generate the reset input signal RSTI which is disabled to a low level.

The reset signal generation unit 400 includes a second inverter 410, a second flip-flop 420, a second NOR gate 430, a third NOR gate 440, and a third inverter 450. The second inverter 410 is configured to invert the reset input signal RSTI. The second flip-flop 420 is configured to receive an output signal of the second inverter 410 through a reset terminal thereof. The second flip-flop 420 is configured to receive a high level voltage, for example, an external voltage VDD (not shown), through an input terminal thereof, and to output the inverted signal RSTB of the reset signal through an output terminal thereof. The second NOR gate 430 is configured to receive the inverted signal RSTB of the reset signal and the pulse width extension signal CLKT. The second flip-flop 420 is configured to receive the output of the second NOR gate 430 through a clock terminal thereof. The third NOR gate 440 is configured to receive the reset input signal RSTI and the inverted signal RSTB of the reset signal, and to generate the enable signal DIVEN. The third inverter 450 is configured to invert the inverted signal RSTB of the reset signal and generate the reset signal RST.

When the reset input signal RSTI is enabled, the second flip-flop 420 is reset by receiving the output of the second inverter 410. Thus, the second flip-flop 420 generates the inverted signal RSTB of the reset signal at a low level. The third inverter 450 inverts the inverted signal RSTB of the reset signal, and generates the reset signal RST which is enabled to a high level. When the reset input signal RSTI is disabled to a low when the inverted signal RSTB of the reset signal is at a low level, the third NOR gate 440 allows the enable signal DIVEN to be enabled to a high level. When the pulse width extension signal CLKT is disabled to a low level when the inverted signal RSTB of the reset signal is at a low level, the second NOR gate 430 outputs a high level signal. When the high level output signal of the second NOR gate 430 is received, the second flip-flop 420 is triggered to provide the external voltage VDD (not shown) to the inverted signal RSTB of the reset signal. Consequently, the inverted signal RSTB of the reset signal is at a high level, and the reset signal RST is disabled to a low level. When the inverted signal RSTB of the reset signal is at a high level, the third NOR gate 440 disables the enable signal DIVEN.

Figure 7:
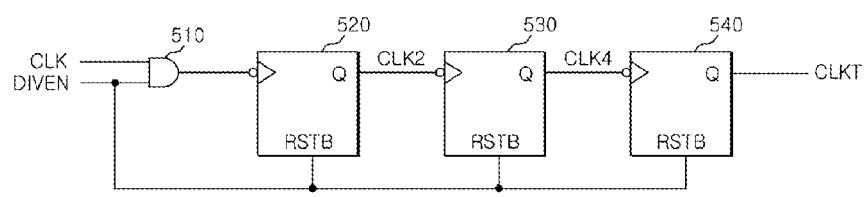
FIG. 7 is a diagram illustrating the configuration of a reset signal expansion unit of FIG. 2 according to an embodiment of the present invention.

FIG. 7 is a diagram illustrating the configuration of the reset signal expansion unit 500 of FIG. 2 according to an embodiment of the present invention. In FIG. 7, the reset signal expansion unit 500 includes a third AND gate 510, and third to fifth flip-flops 520, 530, and 540. The third AND gate 510 is configured to receive the clock signal CLK and the enable signal DIVEN. The third flip-flop 520 is configured to receive the output of the third AND gate 510 through an input terminal thereof, and receive the enable signal DIVEN through a reset terminal thereof. The fourth flip-flop 530 is configured to receive the output of the third flip-flop 520 through an input terminal thereof, and receive the enable signal DIVEN through a reset terminal thereof. The fifth flip-flop 540 is configured to receive the output of the fourth flip-flop 530 through an input terminal thereof, and receive the enable signal DIVEN through a reset terminal thereof.

When the enable signal DIVEN is enabled to a high level, the third AND gate 510 provides the clock signal CLK to the third flip-flop 520. The third to fifth flip-flops 520, 530, and 540 may have a configuration substantially similar to a T flip-flop. Thus, the third to fifth flip-flops 520, 530, and 540 may delay the output of the third AND gate 510, and generate divided clocks CLK2, CLK4, and CLKT, respectively. The output CLK2 of the third flip-flop 520 is a clock signal obtained by dividing the clock signal CLK by 2, the output CLK4 of the fourth flip-flop 530 is a clock signal obtained by dividing the clock signal CLK by 4, and the output CLKT of the fifth flip-flop 540 is a clock signal obtained by dividing the clock signal CLK by 8. The output of the fifth flip-flop 540 is provided as the pulse width extension signal CLKT. When the enable signal DIVEN is disabled to a low level, the third to fifth flip-flops 520, 530, and 540 are reset. The configuration of the reset signal expansion unit 500 including the three flip-flops is for illustrative purposes only, and various numbers of flip-flops may be used for adjusting the pulse width of the reset signal RST.

Figure 8:
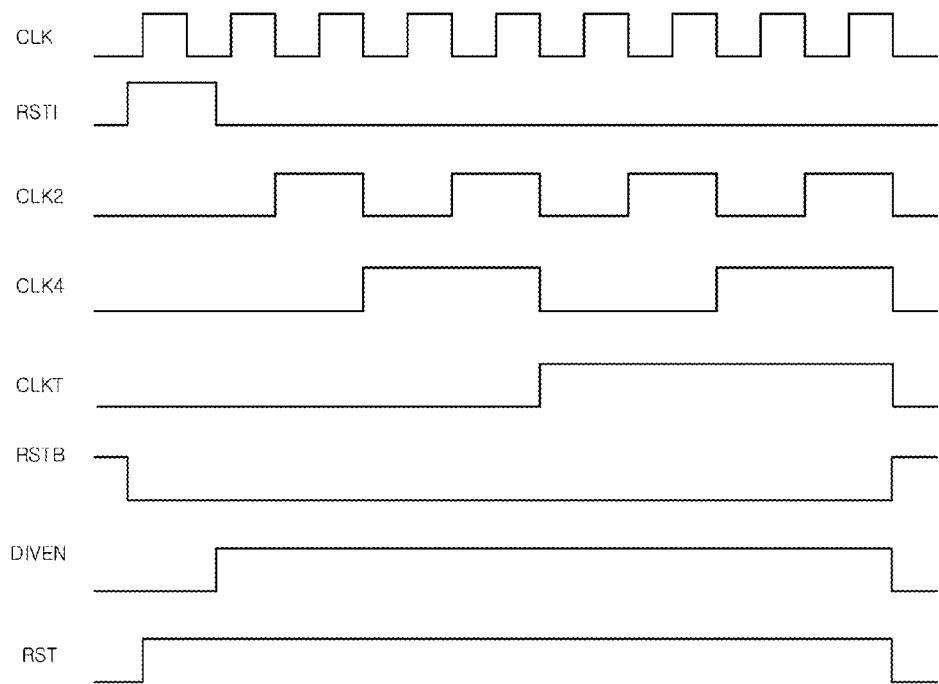
FIG. 8 is a timing diagram illustrating the operation of the reset signal generation apparatus according to an embodiment of the present invention.

FIG. 8 is a timing diagram illustrating the operation of the reset signal generation apparatus 1 according to an embodiment of the present invention. With reference to FIG. 2 to FIG. 8, the operation of the reset signal generation apparatus 1 according to an embodiment of the present invention will be described as follows. When the reset pulse RSTP or the test reset pulse TRSTP is enabled to a low level, the reset input signal RSTI is enabled to a high level. When the reset input signal RSTI is enabled to a high level, the inverted signal RSTB of the reset signal is at a low level and the reset signal RST is enabled to a high level. When the inverted signal RSTB of the reset signal is at a low level and the reset input signal RSTI is disabled to a low level, the enable signal DIVEN is enabled.

When the enable signal DIVEN is enabled, the clock signals CLK2, CLK4, and CLKT divided through the third to fifth flip-flops 520, 530, and 540, respectively, are sequentially generated. The pulse width extension signal CLKT has a cycle corresponding to 8 cycles of a clock signal. Consequently, until the enable signal DIVEN is enabled and the pulse width extension signal CLKT is disabled, it is possible to ensure a time corresponding to approximately 8 cycles of the clock signal. When the pulse width extension signal CLKT is disabled, the inverted signal RSTB of the reset signal becomes a high level signal and the reset signal RST is disabled to a low level. Consequently, it is possible for the reset signal generation apparatus 1 according to an embodiment of the present invention to ensure an additional pulse width of a predetermined time in addition to the reset pulse RSTP and the test reset pulse TRSTP, thereby stably generating a reset signal with a sufficient width.

While certain embodiments have been described above, it will be understood to those skilled in the art that the embodiments described are by way of example only. Accordingly, the reset signal generation apparatus described herein should not be limited based on the described embodiments. Rather, the reset signal generation apparatus described herein should only be limited in light of the claims that follow when taken in conjunction with the above description and accompanying drawings.

What is claimed is:

1. A reset signal generation apparatus comprising:
a test reset pulse generation unit configured to generate a test reset pulse in response to a test signal and a reset signal;
a reset signal generation unit configured to enable the reset signal and an enable signal in response to a reset input signal generated from the test reset pulse, and to disable the reset signal in response to a pulse width extension signal; and
a reset signal expansion unit configured to generate the pulse width extension signal that is enabled for a predetermined time, in response to the enable signal.

2. The reset signal generation apparatus according to claim 1, wherein the test reset pulse generation unit is configured to enable the test reset pulse when the test signal is enabled, and to disable the test reset pulse when the reset signal is enabled.

3. The reset signal generation apparatus according to claim 1, wherein the test signal is a level signal, and the test reset pulse generation unit comprises:
a flip-flop configured to receive the test signal through a clock terminal thereof, receive a high level voltage through an input terminal thereof, and is reset in response to the reset signal; and
an inverter configured to invert a signal output from an output terminal of the flip-flop, and to generate the test reset pulse.

4. The reset signal generation apparatus according to claim 1, wherein the reset signal generation unit is configured to enable the reset signal and the enable signal in response to the reset input signal that is enabled when the test reset signal is enabled, and to disable the reset signal when the pulse width extension signal is disabled.

5. The reset signal generation apparatus according to claim 1, wherein the reset signal expansion unit includes a plurality of flip flops, and is configured to divide a clock signal and generate the pulse width extension signal when the enable signal is enabled.

6. A reset signal generation apparatus comprising:
a reset command combination unit configured to generate a reset pulse in response to a reset command signal;
a test reset pulse generation unit configured to generate a test reset pulse in response to a test signal and a reset signal;
a reset signal generation unit configured to enable the reset signal and an enable signal in response to a reset input signal generated from one or more of the reset pulse and the test reset pulse, and to disable the reset signal in response to a pulse width extension signal; and
a reset signal expansion unit configured to generate the pulse width extension signal that is enabled for a predetermined time, in response to the enable signal.

7. The reset signal generation apparatus according to claim 6, wherein the reset command signal includes one or more of a refresh signal, a DLL initialization signal, a power-up signal, and an MRS signal.

8. The reset signal generation apparatus according to claim 6, wherein the test reset pulse generation unit is configured to enable the test reset pulse when the test signal is enabled, and to disable the test reset pulse when the reset signal is enabled.

9. The reset signal generation apparatus according to claim 6, wherein the test signal is a level signal, and the test reset pulse generation unit comprises:
a flip-flop configured to receive the test signal through a clock terminal thereof, receive a high level voltage through an input terminal thereof, and is reset in response to the reset signal; and
an inverter configured to invert a signal output from an output terminal of the flip-flop, and to generate the test reset pulse.

10. The reset signal generation apparatus according to claim 6, further comprising:
a reset input signal generation unit configured to enable the reset input signal when one or more of the reset pulse and the test reset pulse are enabled.

11. The reset signal generation apparatus according to claim 6, wherein the reset signal generation unit is configured to enable the reset signal and the enable signal in response to the reset input signal, and to disable the reset signal when the pulse width extension signal is disabled.

12. The reset signal generation apparatus according to claim 6, wherein the reset signal expansion unit includes a plurality of flip flops, and is configured to divide a clock signal and generate the pulse width extension signal when the enable signal is enabled.

* * * * *